United States Patent
Murtojarvi

[11] Patent Number: 5,565,821
[45] Date of Patent: Oct. 15, 1996

[54] VOLTAGE CONTROLLED OSCILLATOR WITH IMPROVED TUNING LINEARITY

[75] Inventor: Simo Murtojarvi, Salo, Finland

[73] Assignee: Nokia Mobile Phones Ltd., Salo, Finland

[21] Appl. No.: 492,327

[22] Filed: Jun. 20, 1995

[30] Foreign Application Priority Data

Jun. 21, 1994 [FI] Finland ..................... 942996

[51] Int. Cl.⁶ .................................... H03B 5/18
[52] U.S. Cl. ................ 331/117 D; 331/36 C; 331/96; 331/175; 331/177 V
[58] Field of Search ..................... 331/36 C, 96, 331/99–101, 116 R, 116 FE, 117 R, 117 FE, 117 D, 175, 177 V

[56] References Cited

U.S. PATENT DOCUMENTS

| | | | |
|---|---|---|---|
| 3,582,823 | 6/1971 | Pasos | 331/117 D X |
| 4,492,934 | 1/1985 | Sugimoto | 331/117 R |
| 5,357,222 | 12/1994 | Hietala | 332/124 |
| 5,373,264 | 12/1994 | Higgins, Jr. | 331/177 V X |

FOREIGN PATENT DOCUMENTS

| | | |
|---|---|---|
| 0207650 | 1/1987 | European Pat. Off. . |
| 0267332 | 5/1988 | European Pat. Off. . |
| 0599505 | 6/1994 | European Pat. Off. . |
| 6224632 | 8/1994 | Japan . |

WO93/20615 10/1993 WIPO .

OTHER PUBLICATIONS

Finnish Office Action and English Translation thereof, dated 15 Mar. 1995, Nokia Mobile Phones Ltd., Application No. 942996.

*Primary Examiner*—David Mis
*Attorney, Agent, or Firm*—Perman & Green

[57] ABSTRACT

The object of the invention is a voltage controlled oscillator with improved tuning linearity, which comprises an oscillating transistor (T, 1), a resonator circuit (C11, C12, 11, 12, 19, 20) formed by a capacitance diode (D, 20) and an inductance (L1, 19), whereby the resonator circuit is connected to one of the transistor's (T, 1) electrodes and defines together with the transistor's internal capacitance and external capacitances the oscillator output frequency provided by the transistor. The output frequency can be changed with an external control voltage ($V_{cntrl}$) supplied to the cathode of the capacitance diode (D, 20), the control voltage having minimum and maximum values, whereby the oscillator output frequency ($f_{vco}$) is arranged to change within a certain frequency band in accordance with the control voltage ($V_{cntrl}$). The resonance circuit (RES) is arranged at the current draining electrode (collector) of the transistor to have an effect on the linearity between the control voltage ($V_{cntrl}$) and the output frequency ($f_{vco}$). The resonance circuit according to the invention provides an approximately linear tuning sensitivity also at low control voltages.

18 Claims, 3 Drawing Sheets

VOLTAGE CONTROLLED OSCILLATOR WITH IMPROVED TUNING LINEARITY

BACKGROUND OF THE INVENTION

The present invention relates to a voltage controlled oscillator with improved tuning linearity.

A voltage controlled oscillator VCO is an oscillating circuit whose output frequency changes in accordance with a control voltage supplied to the circuit. The VCO is typically used as one of the components in a phase locked loop PLL. A phase locked loop is often used when both the phases and the frequencies of two signals must be synchronized. Both the phase and the frequency of the VCO output signal are locked to a reference signal or a control voltage signal, whereby the output signal will follow the changes of the reference signal. The output signal, or a signal obtained by dividing it, is compared to the reference signal in the phase comparator of the loop. The phase difference of the signals is transformed using a phase comparator circuit and a filter into an error voltage which is supplied as a control voltage to the voltage controlled oscillator.

The control voltage either increases or decreases the frequency of the oscillator so that the loop is locked. In the locked mode the phase comparator will not output any pulses, so that the control voltage generated by the loop filter remains at a constant value. The slope of the curve describing the VCO's frequency dependence on the control voltage is called the VCO factor. As a general rule we could say that the higher the VCO factor the greater are the noise problems in the loop, and it is difficult to obtain a clean frequency.

A voltage controlled oscillator can be realized in many different ways. Usually it comprises a transistor coupled as an oscillator. An internal capacitance of the transistor may function as the feedback maintaining the transistor's oscillation, whereby the oscillation frequency may range from 1 GHz to 10 GHz using a bipolar transistor, and even higher frequencies are obtained using a FET. A series resonance circuit is arranged at one of the oscillator transistor electrodes, usually at the base (gate) so that it is possible to control the oscillation and to have the circuit operating as a voltage controlled oscillator VCO. According to the desired characteristics this could be designed in different ways, but basically it comprises a capacitance diode, an inductance, e.g. a strip line with one end usually shorted, and the internal capacitance of the transistor. The capacitance diode is generally coupled in series with the strip line, or in parallel with it, and then the anode of the diode is earthed (i.e., grounded) regarding the direct-current voltage. When the control voltage provided by the PLL loop filter (or any other external control voltage) is supplied to act on the cathode of the capacitance diode then the voltage over the diode changes and thus also the capacitance of the diode. Correspondingly the capacitance of the whole oscillator circuit will change, and therefore the amplified oscillating signal frequency provided by the transistor will change in accordance with the control voltage. Without any further linearization measures the linear control range of the VCO is limited when a varactor (capacitance diode) included in the resonance circuit has a non-linear voltage/capacitance characteristic. The modulation sensitivity or the tuning sensitivity of a voltage controlled oscillator, such as a Colpitts oscillator, will change when the tuning voltage changes, and usually its highest non-linearity is at voltages below 2,5 V. Generally this is compensated for by suitable capacitors or capacitance diodes connected in series. The arrangements to cancel the non-linearity of the varactor increase the linear control range of the VCO. Certainly an arrangement of this kind often will limit the total control range. It is also possible to use e.g. a negative bias voltage to the varactor in order to improve the linearity. However, this method will operate properly only with low supply voltages and on a high tuning frequency band.

SUMMARY OF THE INVENTION

An object of the present invention is to present an oscillator having a very linear modulation response, i.e. its tuning sensitivity remains substantially constant over the whole tuning range, also with tuning voltages below 0,7 V Without reducing the tuning range. This is made possible by arranging a resonance at the current drain electrode of the oscillating transistor (at the collector of bipolar transistors, at the drain of MOS and FET transistors), preferably a series resonance circuit which changes the oscillator's input impedance at the desired frequency. Preferably said series resonance circuit is realized by providing a transmission line between the current drain electrode and the component connecting it to the earth. This simple arrangement provides a rather linear tuning sensitivity (modulation sensitivity) of the VCO. The invention provides, in one aspect, a resonance circuit at the transistor's drain electrode to act on the linearity between the control voltage and the output frequency.

In accordance with the invention the oscillator output frequency is arranged to change within a certain frequency band in accordance with the control voltage, wherein for certain output frequencies the oscillator's input impedance is changed in order to linearize the correlation between the control voltage and the output frequency.

BRIEF DESCRIPTION OF THE DRAWINGS

Below an embodiment of the invention is described in detail, by way of example, with reference to the enclosed drawings, in which.

DETAILED DESCRIPTION OF THE PREFERRED EMBODIMENT

Figure 1:
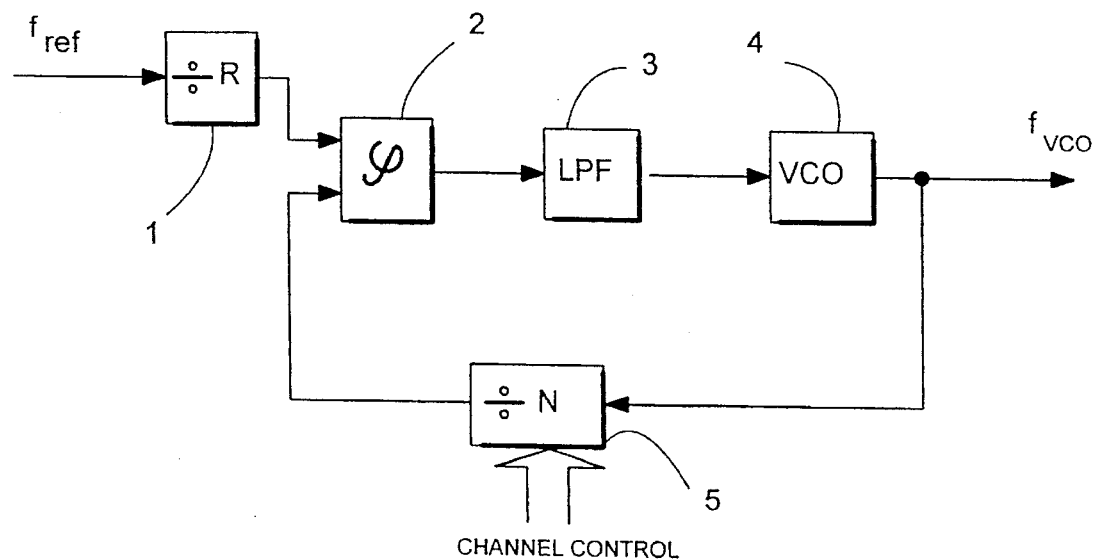
FIG. 1 shows the basic circuit of a phase locked loop.

The phase locked loop of FIG. 1 is typically used in the frequency synthesizer of a radiotelephone. The phase comparator 2 receives the reference frequency $f_{ref}$ which is first divided by the number R in the reference divider 1, and a frequency which is obtained by dividing the output frequency $f_{vco}$ of the voltage controlled oscillator VCO by the number N in the loop divider 5. A signal proportional to the phase difference between these frequencies is filtered in the narrow band low pass filter 3 and supplied as a control voltage to the VCO 4. This voltage changes the output frequency of the VCO, whereby we obtain $f_{vco}=N/R*f_{ref}$, when the loop is in a balanced state. Different output frequencies can be generated by supplying new divisors N to the loop divider, whereby the synthesizer always is tuned to a certain radio channel with a certain number N. In applications requiring high stability the reference frequency is generated by a temperature controlled crystal oscillator.

As was already stated above in the description of the prior art the design of the VCO 4 may vary widely at the component level, even if some basics remain the same. Due to the design it has always a certain frequency band corresponding to a certain control voltage range.

Figure 2:
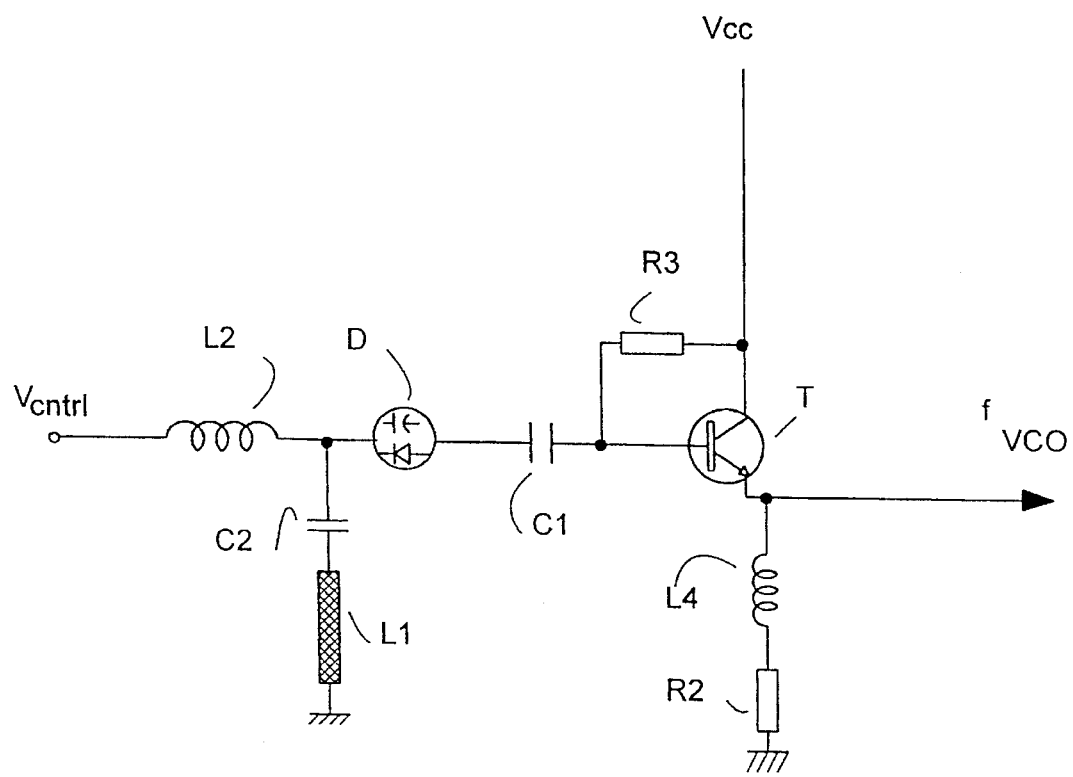
FIG. 2 shows a prior art voltage controlled oscillator.

FIG. 2 shows a prior art oscillator circuit in order to illustrate the basic operation of the oscillator. The described basic VCO design is only one of many possibilities. The VCO described here comprises a transistor T, a capacitance diode D and a strip line L1. The transistor emitter is earthed via an inductance L4, a resistance R2 and a capacitor C3. Together with the feedback resistor R2 they will determine the operating point of the transistor. The capacitor C1 functions as a dc isolating capacitor. The inductance L2 prevents the oscillation frequency signal from reaching the input $V_{cntrl}$ of the VCO (or to reaching the loop filter 3 in the circuit of FIG. 1 ). The circuit oscillates at a frequency determined by the inductance of the strip line L1 and the capacitance of the capacitance diode D and the internal capacitance of the transistor T. The control voltage $V_{cntrl}$ of the oscillator is supplied to the cathode of the capacitance diode D, whereby the voltage over this diode determines its capacitance value and thus the output frequency $f_{vco}$ of the VCO. The control voltage $V_{cntrl}$ may have certain values within a certain voltage range, e.g., 0–5 V.

Figure 3:
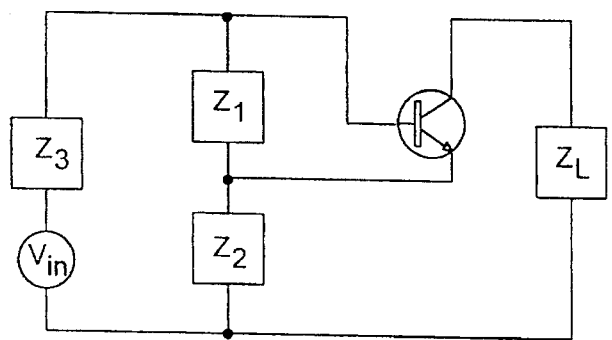
FIG. 3 shows a basic oscillator circuit based on an amplifier (transistor)
Figure 4:
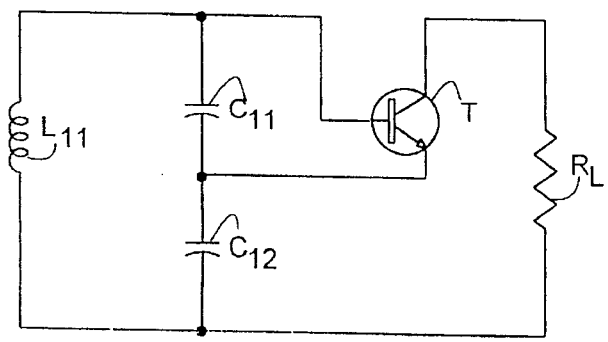
FIG. 4 shows the basic circuit of a Colpitts oscillator.

FIG. 3 shows generally the a basic oscillator circuit based on an amplifier. According to FIG. 3 impedances $Z_1$, $Z_2$ and $Z_3$ are connected around the transistor T and a load $Z_L$ at the output of the transistor which is connected as an oscillator in order to form an oscillating circuit. If the impedances $Z_1$ and $Z_2$ are provided as capacitances $C_{11}$ and $C_{12}$, and the impedance $Z_3$ as an inductance $L_{11}$ (and the output load is illustrated as a resistor $R_L$), then we obtain a so called Colpitts oscillator, the basic circuit of which is shown in FIG. 4. On the other hand, if the impedances $Z_1$ and $Z_2$ are provided as inductances and the impedance $Z_3$ as a capacitance, then we obtain a so called Hartley oscillator. Thus the prior art knows a plurality of oscillators of different types, also a so called Clapp oscillator with a basic structure quite close to that of the Colpitts oscillator.

Figure 5:
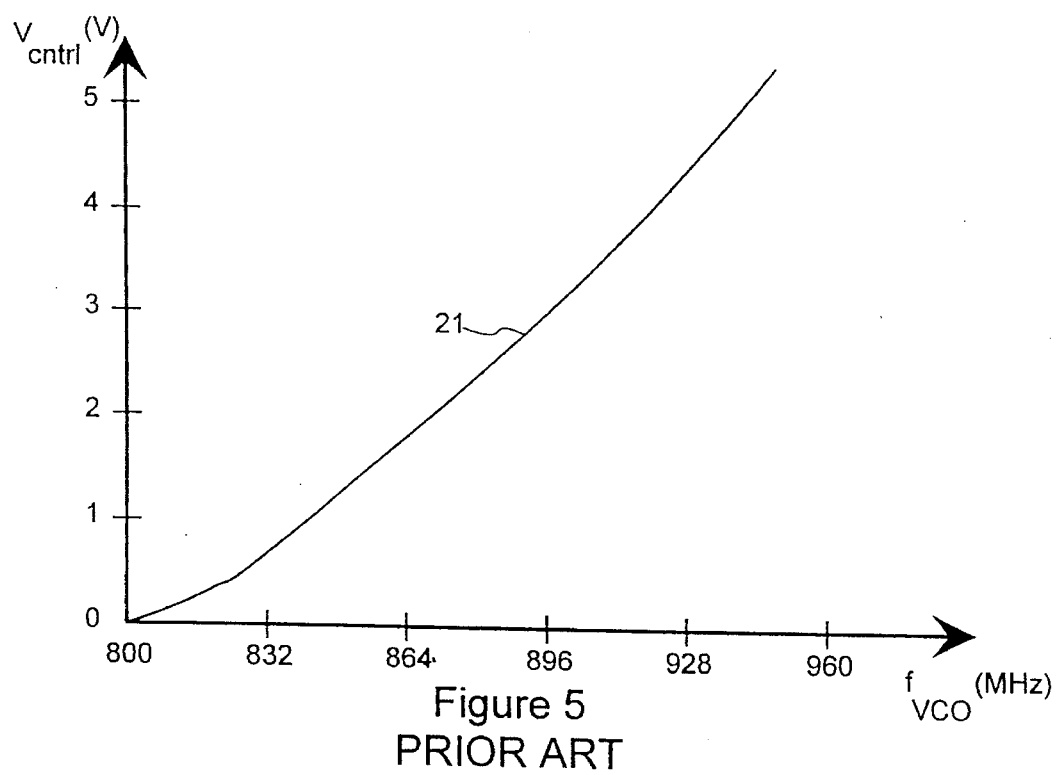
FIG. 5 shows the tuning voltage variation as a function of the frequency in a common Colpitts oscillator circuit.

FIG. 5 shows how the tuning voltage of a typical voltage controlled Colpitts oscillator changes as a function of the frequency. The tuning sensitivity is obtained as the slope of the curve 21 shown in the figure, so that the curve 21 should be as linear as possible. In FIG. 5 we can see, however, that the sensitivity of the oscillator circuit varies according to the tuning frequency. The curve 21 is rather non-linear at voltages below 2,5 V, and particularly non-linear at tuning voltages (the control voltage or input voltage of the oscillator) below 0,7 V. The tuning sensitivity should remain constant, particularly when the oscillator circuit is used in frequency modulation or in accurate frequency synthesization.

Figure 6:
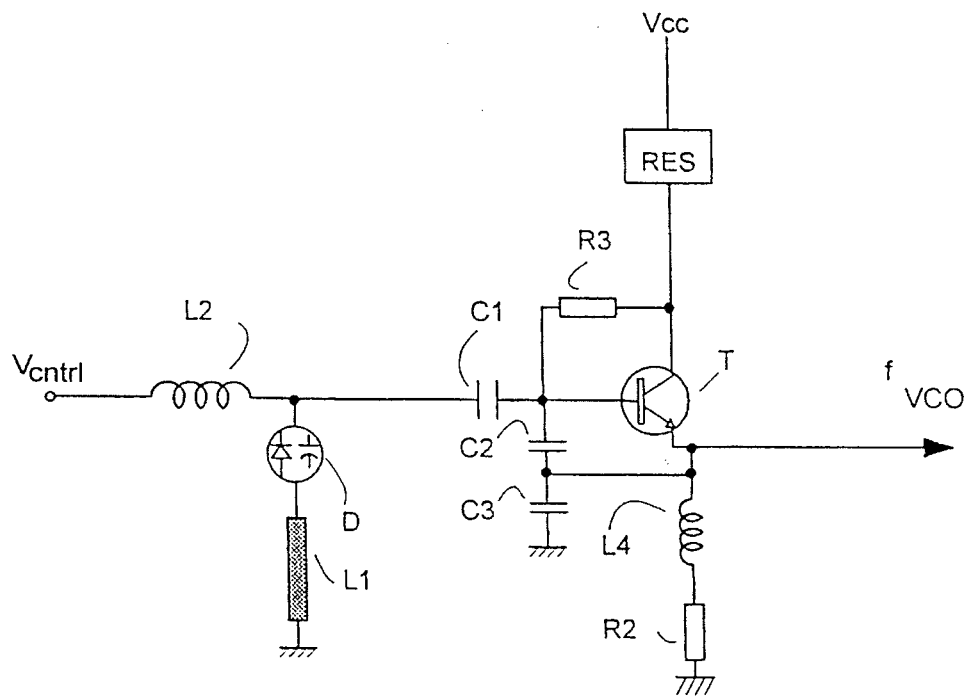
FIG. 6 shows the basic circuit of a voltage controlled oscillator according to the invention.

FIG. 6 shows the basic circuit of a voltage controlled oscillator according to the invention. The circuit is the same as in FIG. 2, but the transistor which is connected as an oscillator has at its collector a resonance circuit RES, which acts on the negative resistance seen at the oscillator input, i.e. it changes the input impedance of the oscillator at a desired frequency, whereby it linearizes the voltage controlled oscillator's tuning sensitivity also at low tuning voltages. The resonance circuit RES can be realized in several different ways, one circuit of which is shown in FIG. 7.

Figure 7:
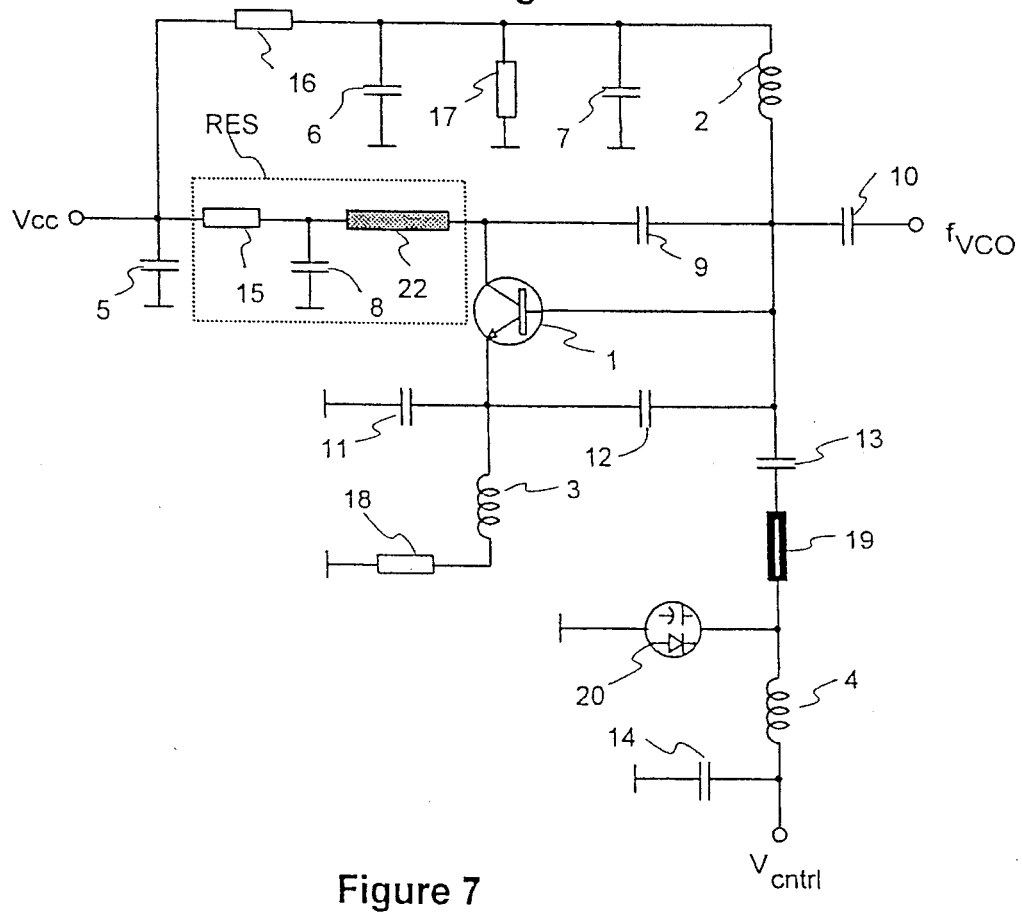
FIG. 7 shows a more detailed circuit diagram of a voltage controlled Colpitts oscillator which is provided with a resonance circuit according to the invention.

FIG. 7 shows an oscillator according to the invention, where a series resonance circuit RES is arranged at the collector to have an effect on the linearity of the oscillator's tuning sensitivity. The voltage controlled oscillator of the Colpitts type shown in FIG. 7 comprises a transistor 1, the capacitors 11 and 12 according to the basic Colpitts structure forming a part of the oscillator's input impedance and together with the transistor 1 having an effect on the oscillation frequency range. The voltage controlled oscillator further comprises a resonance circuit which is formed by a strip line 19 and a capacitance diode 20, with which the oscillation frequency can be controlled by a voltage supplied to the cathode, and a capacitor 13 connected in series with the capacitance diode 20 through the strip line 19, the capacitor 13 affecting the tuning slope, or the slope (the VCO factor) of the curve according to FIG. 5, and thus having an effect on the control range. The emitter of the transistor is connected to earth through she inductance 3 and the resistor 18. The circuit formed by the resisters 16, 17 and capacitors 6, 7 and the coil 2 shown in the figure generates a dc base current to the transistor 1, with which the transistor is arranged to be at the desired operating point and operating mode. The inductance 4 prevents the oscillation frequency signal from reaching the oscillator's input. The circuit will oscillate at a frequency which is determined by the inductance of the strip line and the capacitance of the capacitance diode 20, as well as the internal capacitance of the transistor T and the capacitances of the capacitors 11 and 20.

According to the invention a series resonance circuit RES is connected at the collector of the transistor 1, and thus this circuit also has an effect on the circuit's oscillating frequency. Here the resonance circuit RES is formed by a transmission line 22 and a capacitor 8 connected between the other end of the transmission line and earth. Between the supply voltage Vcc and the common point of the transmission line 22 and the capacitor 8 there is a series resistance 15 which affects the attenuation of the series resonance circuit RES. The transmission line 22 can also be replaced e.g. by an inductor, at least at low frequencies. With the series resonance circuit RES connected at the collector of the transistor 1, as is shown in FIG. 7, an improved linearity is obtained without reducing the tuning range of the oscillator. A substantially linear tuning sensitivity is obtained on a very large tuning frequency band, even at voltages below 0,7 V, without, limiting the active tuning range.

We claim:

1. A voltage controlled oscillator comprising:

an oscillating transistor;

a resonator circuit formed by a capacitance diode and an inductance, whereby the resonator circuit is connected to one of the transistor's electrodes and defines together with the transistor's internal capacitance and external capacitances the oscillator output frequency provided by the transistor, whereby the output frequency can be changed with an external control voltage supplied to the cathode of the capacitance diode, the control voltage having minimum and maximum values, whereby the oscillator output frequency is arranged to change within a certain frequency band in accordance with the control voltage, wherein a further resonant circuit is coupled to a current drain electrode of the transistor so as to have an effect on a linearity between at least some values of the control voltage and the output frequency.

2. The voltage controlled oscillator of claim 1, wherein the further resonant circuit is comprised of a series resonant circuit.

3. The voltage controlled oscillator of claim 1, wherein the further resonant circuit comprises a transmission line having a first end coupled to the current drain electrode of the transistor, and wherein a second end of the transmission line is coupled to an earthed capacitance.

4. The voltage controlled oscillator of claim 3, wherein the further resonant circuit comprises a resistance coupled between a supply voltage and a common point of the transmission line and the earthed capacitance.

5. The voltage controlled oscillator of claim 1, wherein the transistor is a bipolar transistor and wherein the transistor's current drain electrode is the transistor's collector.

6. The voltage controlled oscillator of claim 1, wherein the transistor is a FET transistor and wherein the transistor's current drain electrode is the transistor's drain.

7. The voltage controlled oscillator of claim 1, wherein the transistor is a MOS transistor and wherein the transistor's current drain electrode is the transistor's drain.

8. A method to linearize the tuning sensitivity of a voltage controlled oscillator, the oscillator comprising an oscillating transistor and a resonator circuit formed by a capacitance diode and an inductance, whereby the resonator circuit is connected to one of the transistor's electrodes and defines together with the transistor's internal capacitance and the external capacitances an output frequency provided by the transistor, whereby the output frequency can be changed with an external control voltage supplied to the cathode of the capacitance diode, the control voltage having minimum and maximum values, the method comprising the steps of:

arranging the oscillator output frequency to change within a predetermined frequency band in accordance with the applied control voltage value; and for a predetermined portion of the output frequency band, changing an input impedance of the voltage controlled oscillator in order to linearize a correlation between the value of the control voltage and the output frequency within the predetermined portion of the output frequency band.

9. The method according to claim 8, wherein the oscillator's input impedance is changed by a step of coupling a further resonant circuit at a current drain electrode of the transistor.

10. A voltage controlled oscillator comprising:

a transistor and a first resonator circuit coupled to a first terminal of the transistor so as to form, in combination with bias and feedback means, an oscillation circuit, an oscillating frequency of the oscillation circuit that is output from an output terminal of the transistor being controlled by an external voltage supplied to the first resonator circuit; and a second resonator circuit coupled to a second terminal of the transistor for linearizing the tuning characteristics of the oscillation circuit.

11. A voltage controlled oscillator as set forth in claim 10, wherein said second resonator circuit is coupled to a current drain terminal of the transistor to have an effect on the linearity of the oscillating frequency between minimum and maximum values of the external voltage.

12. A voltage controlled oscillator as set forth in claim 10, wherein the second resonator circuit is comprised of a series resonant circuit.

13. A voltage controlled oscillator as set forth in claim 11, wherein the second resonator circuit is comprised of a transmission line having a first end coupled to the current drain terminal of the transistor, wherein a second end of the transmission line is coupled to an earthed capacitance.

14. A voltage controlled oscillator as set forth in claim 13, wherein the second resonator circuit is further comprised of a resistance coupled between a supply voltage and a common point of the transmission line and the earthed capacitance.

15. A voltage controlled oscillator as set forth in claim 11, wherein the transistor is a bipolar transistor and wherein the transistor's current drain terminal is the transistor's collector.

16. A voltage controlled oscillator as set forth in claim 11, wherein the transistor is a FET transistor and wherein the transistor's current drain terminal is the transistor's drain.

17. A voltage controlled oscillator as set forth in claim 11, wherein the transistor is a MOS transistor and wherein the transistor's current drain electrode is the transistor's drain.

18. A voltage controlled oscillator as set forth in claim 10, wherein said second resonator circuit is coupled to a current drain terminal of the transistor to improve the linearity of the oscillating frequency at values of the external voltage below approximately 0.7 volts.

* * * * *